United States Patent
Male et al.

(10) Patent No.: US 9,865,537 B1
(45) Date of Patent: Jan. 9, 2018

(54) METHODS AND APPARATUS FOR INTEGRATED CIRCUIT FAILSAFE FUSE PACKAGE WITH ARC ARREST

(71) Applicant: Texas Instruments Incorporated, Dallas, TX (US)

(72) Inventors: Barry Jon Male, West Granby, CT (US); Steve Kummerl, Carrollton, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,817

(22) Filed: Dec. 30, 2016

(51) Int. Cl.
| | |
|---|---|
| H01L 29/00 | (2006.01) |
| H01L 23/525 | (2006.01) |
| H01L 23/00 | (2006.01) |
| H01L 23/495 | (2006.01) |
| H01L 23/31 | (2006.01) |
| H01L 21/56 | (2006.01) |

(52) U.S. Cl.
CPC .......... *H01L 23/5256* (2013.01); *H01L 21/56* (2013.01); *H01L 23/315* (2013.01); *H01L 23/49503* (2013.01); *H01L 23/49517* (2013.01); *H01L 23/562* (2013.01); *H01L 24/48* (2013.01); *H01L 24/49* (2013.01); *H01L 2224/48245* (2013.01)

(58) Field of Classification Search
CPC ... H01L 23/5256; H01L 23/315; H01L 21/56; H01L 23/49503; H01L 23/49517; H01L 23/562; H01L 24/48; H01L 24/49
USPC ................ 257/665, 173, 529, 666, 667, 676
See application file for complete search history.

(56) References Cited

U.S. PATENT DOCUMENTS

| | | |
|---|---|---|
| 4,007,978 A | 2/1977 | Holton |
| 4,267,484 A | 5/1981 | O'Loughlin |
| 4,272,753 A | 6/1981 | Nicolay |
| 5,389,578 A | 2/1995 | Hodson et al. |

(Continued)

FOREIGN PATENT DOCUMENTS

EP   1986297 A2   10/2008

OTHER PUBLICATIONS

OSRAM Opto Semiconductors GmbH, Oslon Compact (850nm), version 1.6, SFH 4710, dated Dec. 1, 2015 (13 pages).

(Continued)

*Primary Examiner* — Thien F Tran
(74) *Attorney, Agent, or Firm* — John R. Pessetto; Charles A. Brill; Frank D. Cimino

(57) ABSTRACT

In described examples, an apparatus includes: an integrated circuit die having multiple terminals; the integrated circuit die positioned on a die pad portion of a leadframe having leads for external connections, at least some of the leads having an inner portion electrically coupled to at least one terminal of the integrated circuit die; a fuse element coupled between one of the leads of the leadframe and at least one terminal selected from the multiple terminals of the integrated circuit die; and encapsulation material surrounding the integrated circuit die and the leadframe to form a packaged integrated circuit including the integrated circuit die and the fuse element, and having a cavity in the encapsulation material surrounding the fuse element such that the fuse element is spaced from the encapsulation material.

15 Claims, 4 Drawing Sheets

(56) References Cited

U.S. PATENT DOCUMENTS

| | | | |
|---|---|---|---|
| 5,929,514 | A | 7/1999 | Yalamanchili |
| 6,365,433 | B1* | 4/2002 | Hyoudo .................. H01L 21/50 |
| | | | 257/529 |
| 6,507,264 | B1 | 1/2003 | Whitney |
| 6,509,574 | B2 | 1/2003 | Yuan et al. |
| 6,815,808 | B2* | 11/2004 | Hyodo .................. H01L 23/055 |
| | | | 257/352 |
| 6,977,468 | B1 | 12/2005 | Baginski |
| 7,015,587 | B1 | 3/2006 | Poddar |
| 7,321,162 | B1 | 1/2008 | Lee et al. |
| 7,732,892 | B2 | 6/2010 | Jeng et al. |
| 7,842,542 | B2 | 11/2010 | Shim et al. |
| 7,869,180 | B2 | 1/2011 | Cheung et al. |
| 8,018,705 | B2 | 9/2011 | Michalopoulos et al. |
| 8,436,460 | B1 | 5/2013 | Gamboa et al. |
| 8,569,082 | B2 | 10/2013 | Kummerl et al. |
| 8,633,551 | B1 | 1/2014 | Teh et al. |
| 9,184,012 | B2 | 11/2015 | Wang |
| 9,419,075 | B1 | 8/2016 | Carothers et al. |
| 2003/0183916 | A1 | 10/2003 | Heck et al. |
| 2004/0084729 | A1 | 5/2004 | Leung et al. |
| 2007/0076421 | A1 | 4/2007 | Kogo |
| 2007/0229177 | A1 | 10/2007 | Moriya |
| 2008/0266730 | A1 | 10/2008 | Viborg et al. |
| 2010/0187652 | A1 | 7/2010 | Yang |
| 2011/0233790 | A1 | 9/2011 | Bchir |
| 2013/0134445 | A1 | 5/2013 | Tarsa |
| 2013/0194057 | A1 | 8/2013 | Ruby |
| 2013/0320548 | A1 | 12/2013 | Carpenter et al. |
| 2013/0329324 | A1 | 12/2013 | Tziviskos et al. |
| 2014/0001632 | A1 | 1/2014 | Uehling et al. |
| 2014/0264905 | A1 | 9/2014 | Lee et al. |
| 2015/0035091 | A1 | 2/2015 | Liglioli |
| 2015/0069537 | A1 | 3/2015 | Lo et al. |
| 2015/0249043 | A1 | 9/2015 | Elian |
| 2015/0369681 | A1 | 12/2015 | Imai |
| 2015/0369682 | A1 | 12/2015 | Nakajima |
| 2015/0380353 | A1* | 12/2015 | Bauer ............... H01L 23/49562 |
| | | | 257/529 |
| 2016/0003436 | A1 | 1/2016 | Singer |
| 2016/0167089 | A1 | 6/2016 | Ng |
| 2016/0209285 | A1 | 7/2016 | Nakajima |
| 2017/0089789 | A1 | 3/2017 | Kanemoto |
| 2017/0134004 | A1 | 5/2017 | Isozaki |

OTHER PUBLICATIONS

International Search Report for PCT/US2017/031987 dated Sep. 7, 2017.
Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).
National Semiconductor Corporation, "Semiconductor Packaging Assembly Technology," National Semiconductor Corporation, Aug. 1999, pp. 1-8.
Cook, et al.: "Floating Die Package"; U.S. Appl. No. 15/248,151, filed Aug. 26, 2016; 34 pages.
Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).
Texas Instruments Product Brochure ISO7841x High-Performance, 8000-Vpk Reinforced Quad-Channel Digital Isolator, dated Nov. 2014 (37 pages).
Texas Instruments Application Report "The ISO72x Family of High-Speed Digital Isolators," SLLA198—Jan. 2006 (12 pages).
Texas Instruments Developers Guide "Digital Isolator Design Guide," SLLA284A, Jan. 2009 (19 pages).
Wikipedia article "3D Printing," retrieved from "http://en.wikipedia.org/w/index.php?title=3D_printing&oldid=624190184", dated Sep. 4, 2014 (35 pages).

* cited by examiner

METHODS AND APPARATUS FOR INTEGRATED CIRCUIT FAILSAFE FUSE PACKAGE WITH ARC ARREST

TECHNICAL FIELD

This relates generally to integrated circuit packaging, and more particularly to a method and apparatus for an integrated circuit in a package with a failsafe fuse and arc arrest.

BACKGROUND

Co-owned U.S. patent application Ser. No. 15/248,151, filed Aug. 26, 2016, entitled "FLOATING DIE PACKAGE", (the '151 Application) naming Benjamin Stassen Cook as inventor, which application is hereby incorporated by reference in its entirety herein, describes an integrated circuit package with a cavity formed within a molded package by sublimation and use of a sacrificial material to form the cavity.

Fuses are protective elements in electrical circuits that operate by creating an open circuit under certain conditions. The purpose of a fuse varies according to the application. In some cases, fuses are used as programmable elements to reconfigure logic or memory circuits. More traditionally, a fuse creates a failsafe circuit element to protect an electrical system from overcurrent conditions that can damage wiring or other components within the system. The fuse is either reversibly or irreversibly physically changed to open a circuit during the overcurrent conditions. The open circuit stops current flow before permanent damage occurs elsewhere in the system.

Conventional fuses are composed of a metal filament that melts and creates an open circuit after a pre-determined amount of current flows through it. A fusible link has metal or conductive components connected by a sacrificial portion that melts, such as solder or a small diameter wire. Conductive traces with a small cross-section can also be used. The open circuit is created when current passes through the fuse element, causing the fuse element to heat enough that the fuse element melts or "blows". During the melting phase, as the current begins to be interrupted and the open forms, an arc can form which vaporizes a portion of the fuse material. The arc will grow, consuming and vaporizing the fuse element, until the distance becomes too long to sustain the arc and current stops flowing. In some molded integrated circuit packages, if a fuse is included in the package, carbonization of the mold compound can occur, and filaments or filler in the mold compound may become conductive paths that continue to carry current.

Fuse material that is vaporized when a fuse blows is deposited in the local area and the probability of creating a secondary conductive path arises. To contain the vaporized material and prevent electrical conduction in the aftermath of the arc, traditional fuses are encapsulated in a non-conductive glass vial surrounding the fuse element. In higher current fuses, the fuse element is contained within a non-conductive ceramic container that is packed with quartz sand. In the case of the glass vial, the vaporized fuse material is contained by the glass with some of it coating the glass, however the vaporized material is so widely dispersed that a secondary conductive path is not formed. In the case of a sand filled fuse container, the vaporized fuse material is dispersed among the sand and the heat from the fusing arc melts the sand forming a glass that prevents current flow.

With the increasing use of integrated circuits, miniaturization of fuses plays a part in the effort to reduce product sizes and costs while still protecting circuits. Higher current fuses result in higher temperatures and additional opportunity for the regrowth of a secondary conductive path. A fuse on an integrated circuit has upper limits on the current capacity as a result of the small geometries and the cost resulting from the multiple levels of masks needed to form the fuses. To attain higher current fuses, the fuse elements are sometimes moved to the PCB where the IC is mounted, or placed off the integrated circuit die but still located inside the package. The disadvantage of creating a fuse from an element of the PCB is that when blown, the entire PCB can require replacing, a cost prohibitive repair. A more practical solution is to form a fuse within a package so that in case of a blown fuse, only the packaged part needs to be replaced. In an application using a semiconductor power device, a common overstress failure mode is a shorted device (e.g., a current path to ground). MOSFET devices forming power switches sometimes fail in a shorted state with a path to ground due to an overvoltage, an ESD strike, exceeding safe operating conditions for the device or from a defect in the manufacture of the device. These failure modes require a fuse element to protect the system.

An on-chip fuse element or fusible link, such as a bond wire encapsulated in an IC package, will often form a secondary conductive path during an overcurrent event. The secondary conductive path can form after the high current superheated arc expands and burns the surrounding mold compound to form a carbonized conductive path. The secondary conductive path sustains the arc until the device burns up sufficiently to extinguish the arc. Catastrophic damage to the device and often to the printed circuit board the device is mounted on can occur before the arc is extinguished. A need continues to exist for an improved fuse apparatus for integrated circuit packages that is able to interrupt high currents, have a low probability of a secondary conductive path forming, and fit within the semiconductor package.

SUMMARY

In described examples, an apparatus includes: an integrated circuit die having multiple terminals; the integrated circuit die positioned on a die pad portion of a leadframe having leads for external connections, at least some of the leads having an inner portion electrically coupled to at least one terminal of the integrated circuit die; a fuse element coupled between one of the leads of the leadframe and at least one terminal selected from the multiple terminals of the integrated circuit die; and encapsulation material surrounding the integrated circuit die and the leadframe to form a packaged integrated circuit including the integrated circuit die and the fuse element, and having a cavity in the encapsulation material surrounding the fuse element such that the fuse element is spaced from the encapsulation material.

DETAILED DESCRIPTION OF EXAMPLE EMBODIMENTS

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

As described hereinabove, preventing a secondary conductive path from forming after a fuse blows is a key element in creating a high reliability failsafe fuse. An example embodiment uses a sublimation process such as taught in the '151 Application to form a cavity in the encapsulation material around a fuse element within a semiconductor package. The fuse element can be referred to as a "fusible link". The fuse element or fusible link will separate to form an open circuit during an event where overcurrent conditions cause the fuse element to melt or "blow". The cavity created by the sublimation process will enable a high current arc that occurs during the overcurrent event to extinguish itself without further damage to the integrated circuit package or to the system, and to prevent a secondary conductive path from forming.

One example in the '151 Application uses a sublimatable sacrificial encapsulant material (SSEM) that can be removed during the molding process by a phase change sublimation process. In an embodiment of the '151 Application, the sublimation forms cavities to allow a die to "float" free of the lead frame, only secured by the bond wires, after the molding process has been completed. In an example embodiment, the sublimation technology is used in a different manner to create a cavity within the semiconductor package wherein a fuse element such as a wire or shaped metal strip is contained in the cavity. A vent is created to allow the sacrificial sublimation material to exit the cavity in the gaseous phase during assembly of the packaged IC. In an embodiment of the present application, the vent can also be used as a pressure release vent during an overcurrent event where the fuse material heats up prior to separation. In another arrangement that forms an alternative embodiment, the SSEM material is kept in the cavity surrounding the fuse element, and is sublimated by the temperature increase in the fuse element during an overcurrent event, and subsequently vented from the package as a gas.

Figure 1A:
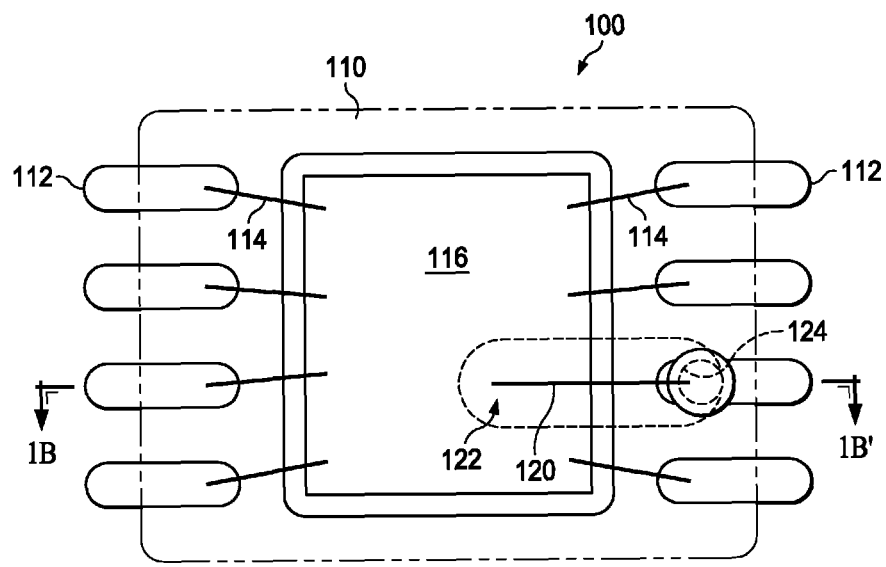
FIGS. 1A and 1B show a top view and cross-sectional view, respectively, of an encapsulated semiconductor packaged device with an example embodiment cavity with a fuse element.
Figure 1B:
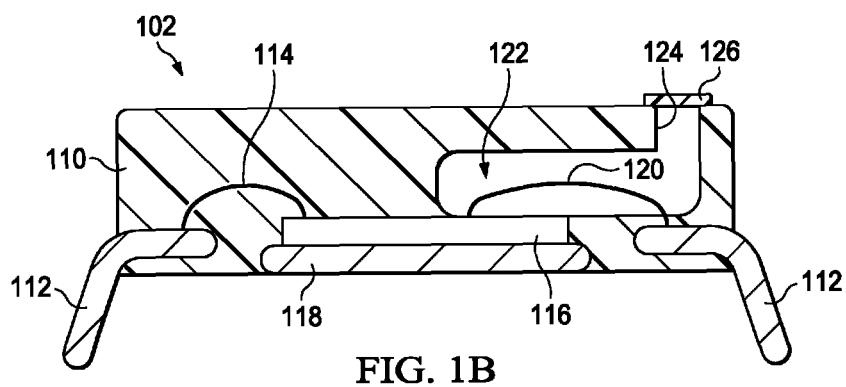

FIGS. 1A and 1B show a top view and cross-sectional view, respectively, of an encapsulated semiconductor packaged device in an example embodiment including a cavity with a fuse element. FIG. 1B is taken along the sectional line 1B-1B' in top view 100 of FIG. 1A. In the top view 100 and cross-section 102 of a packaged device, a lead frame with leads 112 and a die pad and heat spreader 118 are shown. Mounted to the heat spreader 118 is an integrated circuit (a power IC for example) 116. Bond wires 114 connect the power IC 116 to seven of eight individual leads 112 and a fuse element such as a bond wire 120 is attached to the eighth lead. The entire assembly is encapsulated using a mold compound 110. A cavity 122 is formed by a sublimation as taught by the '151 Application with a vent 124 that is sealed with a vent cover that is a thin film 126. The cavity 122 surrounds the fuse element or bond wire 120. In alternative embodiments, the fuse element can be a conductive metal strip or a thinned portion of a metal conductor arranged to melt in an overcurrent condition. This example embodiment is configured with the power IC 116 arranged with the fuse element 120 within a cavity 122 created by the sublimation process.

Figure 2:
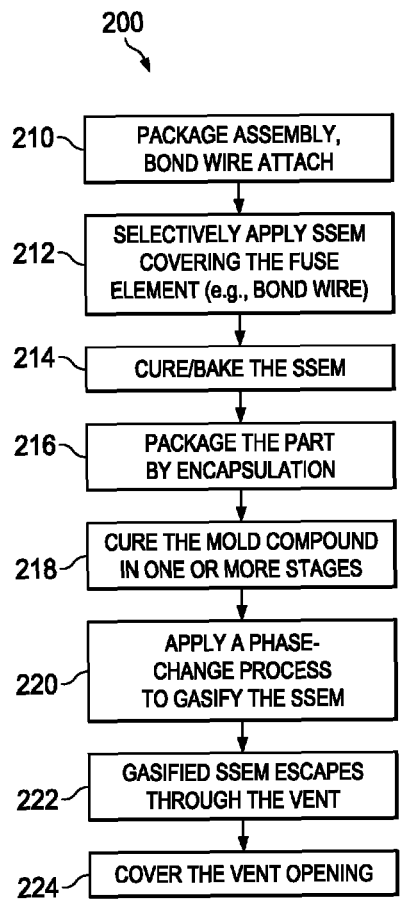
FIG. 2 is a flow chart for a method embodiment for forming the packaged device of FIG. 1.

FIG. 2 is a flow chart for a method embodiment for forming the packaged device of FIG. 1. In FIG. 2, method 200 begins with step 210 where a die is mounted to a die pad of the lead frame and bond wires have been attached between the die and the lead frame. Multiple processes can be used to achieve the state outlined in step 210. At step 212, SSEM is applied to the assembly forming an area similar to the cavity shape 122 shown in FIG. 1, with the fuse element such as a bond wire or metal strip surrounded by SSEM. The encapsulant can be a polyol material with sublimation conditions outside the expected package processing temperatures, such as the mold cure temperature or solder reflow temperature. The SSEM can be heated and applied as an extruded bead or can be dissolved in the appropriate solvents and applied as a liquid or as a gel using a syringe dispensing system that selectively applies the SSEM. After the SSEM has been applied to the appropriate locations, the method transitions to step 214. At step 214, the SSEM is cured in one or more steps. At the following step 216, mold compound is applied over the lead frame assembly including SSEM leaving one or more pinhole vents to provide for a path between the SSEM and the outside environment. In one approach a transfer mold is used with an epoxy resin that is heated to a liquid state and is then forced into the mold under pressure. Other encapsulation techniques can also be used. The vents provide a path for the gaseous SSEM to escape in subsequent processing steps. In step 218 the mold compound is cured in one or more steps. In the next step 220, the phase change process is applied to the assembly and the SSEM changes to a gas 222 as a result of the phase change process. The gaseous SSEM escapes through one or more vents to the surrounding atmosphere. The vent can be as small as a pinhole, or can be a larger diameter. A cavity remains in the encapsulated package where the SSEM previously resided and fills with the surrounding atmosphere. The final step 224, the vents are covered with a vent cover material by a process compatible with the package processing, such as a screen print or B-stage film. Any additional package processing steps (for example, singulation, lead trim and form, marking) are completed and the final packaged integrated circuit is ready for use.

Figure 3A:
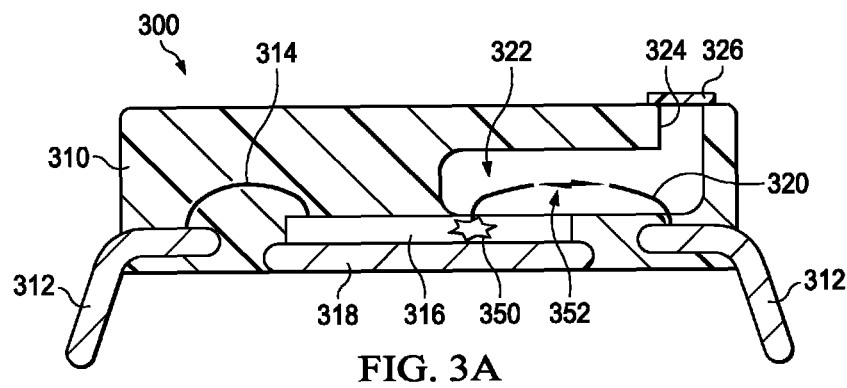
FIGS. 3A and 3B show two cross-sectional views illustrating how an arc is extinguished in an example embodiment.
Figure 3B:
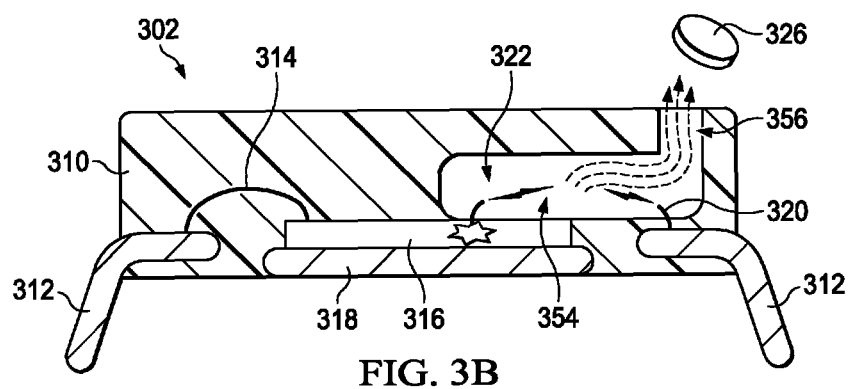

FIGS. 3A and 3B show two cross-sectional views illustrating how an arc is extinguished in an example embodiment including a package containing a fuse element. In FIG. 3A, cross-section 300 of a packaged device shows a lead frame including leads 312 and a die pad and heat spreader 318. Mounted to the heat spreader 318 is an integrated circuit 316, such as a power IC. While in this example embodiment, the IC 316 is a power IC, other device types can be used as well. Bond wires 314 connect the power IC 316 to individual leads 312 and a fuse element, bond wire 320 in this example, is attached to a lead 312. The entire assembly is covered in a mold compound 310. A cavity 322 surrounds the fuse element, bond wire 320, and the vent 324. A thin film 326 covers the vent 324. In alternative arrangements, the fuse element 320 can be formed of bond wires of different sizes with the fuse portion being of a smaller dimension than the remaining portions. In additional arrangements, the fuse element can be a fusible link, including conductive metal portions with a solder or other sacrificial conductive material joining the conductive metal portions, the fusible link opens in an overcurrent situation when the solder melts. In an additional arrangement, the fuse element can be a metal conductor with a thinner portion designed to melt and open in an overcurrent event.

FIG. 3A depicts the power IC 316 during a fault resulting in a high current flow (shown as 350). The bond wire 320 or other fuse element will heat and melt, which begins to create an open circuit. An arc 352 will instantly form to allow the current to continue to flow. Referring to FIG. 3B, in cross-section 302, the arc now labeled 354 will continue to grow with the fuse elements such as bond wire 320 being vaporized by the several thousand degree temperature of the arc. The rising temperatures created by the arc results in the pressure inside the cavity 322 building until the vent cover 326 fails and the super-heated, vaporized bond wire gas is expelled out of the vent hole (shown as 356 in FIG. 3B). The release of pressure causes the arc to blow-out and with little vaporized bond wire material left inside the cavity, the probability of reforming a secondary conductive path is very low.

Figure 4:
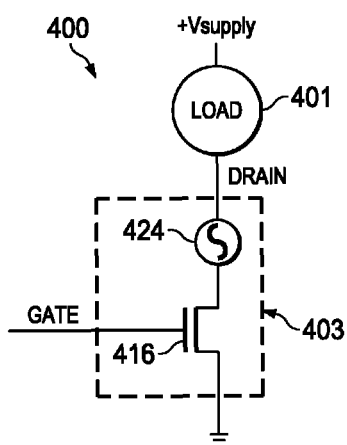
FIG. 4 is a circuit diagram illustrating an application using a low side driver FET device that incorporates an embodiment.

FIG. 4 is a circuit diagram illustrating an application using a low side driver FET device that incorporates an embodiment. In FIG. 4, a circuit 400 includes a load 401 coupled to a power supply labeled+Vsupply. The low side driver FET device 403 couples the ground terminal to the load 401 responsive to a control voltage on the gate terminal GATE for the low side driver FET integrated circuit device 403. In this example, the drain terminal DRAIN for the low side driver FET is coupled to the load device. In an example, the load can include resistive and inductive circuit elements coupled to the low side driver FET integrated circuit 403. A fuse element 424 is shown within the package of low side driver FET 403. The transistor 416 is connected in series between the drain terminal and ground, having a current conduction path between the drain terminal for coupling the load in series with the fuse element 424 and the drain of the FET 416, the current conduction path including the source of the transistor 416 and the series path extending to the ground terminal. In a particular example, the low side driver FET 416 can be a high voltage, low on-resistance FET such as a NexFET™ device supplied by Texas Instruments Incorporated, the owner of the present application. Other FET devices appropriate for a particular application can also be used with the embodiments. In FIG. 4 the FET is in a "source down" or "low-side" configuration with load coupled to the positive power supply and the FET integrated circuit 403 coupled between the load and the ground terminal. In an alternative arrangement, the FET can be coupled in a "high side" configuration with the load coupled to a ground terminal, and the FET between the positive supply and the load to form an additional embodiment. In the embodiments the fuse element 424 is in series with the current conduction path of the FET. In an overcurrent situation, the fuse element 424 will open, creating an open circuit and protecting the load from damage.

Figure 5A:
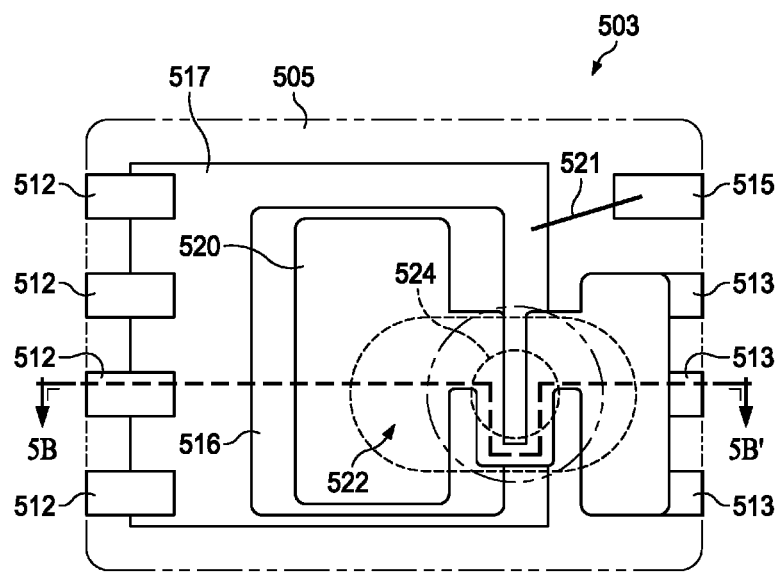
FIGS. 5A and 5B are a top view and a cross-sectional view, respectively, of an example embodiment including a power FET in an IC package.
Figure 5B:
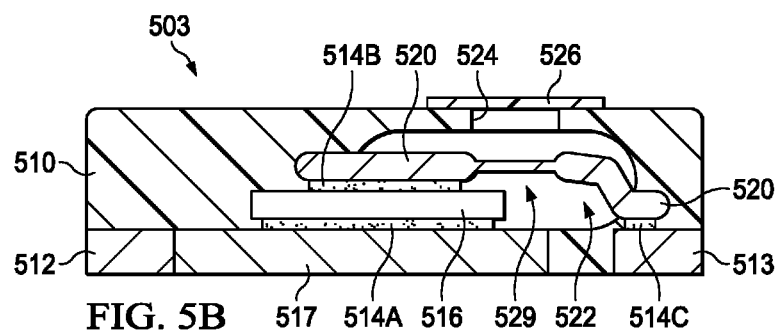

FIGS. 5A and 5B are a top view and a cross-sectional view, respectively, of an example embodiment including a power FET in an IC package with a fuse element in a cavity formed by the use of the SSEM process. In FIG. 5A, a top view of an integrated circuit power FET device 503 includes a package 505 surrounding an assembly. The package 505 can include a molding compound 510 such as an epoxy resin and can include various filler materials, thermally conductive materials, flame retardants and other known materials for IC packaging. The package 505 includes a leadframe 517, a power integrated circuit die 516 mounted on the leadframe 517, a cavity 522 surrounding a fuse element 529 in a metal clip portion 520, a vent hole 524 extending vertically from the cavity 522 to the upper surface of the package 505, and a vent cover 526 over the vent hole 524.

FIG. 5B is a cross-sectional view taken along the section line 5B-5B' in FIG. 5A. In FIG. 5B, terminals 512 are coupled to the source of the FET device 516 by a conductive die attach material 514A. The FET device in this example is a vertical FET such as, for example, a NexFET™ device from Texas Instruments, Incorporated. In a vertical FET device, the semiconductor substrate of the integrated circuit die forms the source contact that can be contacted at a bottom surface of the integrated circuit die. Another die attach portion 514B forms a drain contact to the FET 516. A conductive metal clip 520 contacts the drain of the vertical FET device at the upper die attach pad 514B. The conductive metal clip 520 includes a portion 529 with a smaller cross-section that forms the fuse element. Metals used in integrated circuit assemblies such as copper and its alloys, aluminum and its alloys, gold, and other conductors can be used. In an embodiment, the fuse element portion 529 of metal clip 520 is positioned in a cavity 522 and is spaced from the remainder of the mold compound material forming package 505. Terminals 513 of leadframe 517 are coupled to the drain of the FET device 516 by the metal clip 520 and fuse element 522. A die attach portion 514C couples the terminals 513, which are provided as part of a lead frame 517, to the conductive metal clip 520 and then to FET device 516. A gate terminal 515, another portion of the leadframe 517, is coupled to the FET device 516 by a bond wire 521. As seen in FIG. 5A, fuse element 529 can take a variety of shapes and can be serpentine, winding, or formed into other shapes to lengthen the narrowed portion, if required.

In operation, after a short circuit fault in the load, in the FET or another event causes an overcurrent situation, the fuse element 529 will melt to create an open circuit. An arc will form instantly and begin to vaporize and consume the fuse element 529. In an arrangement with a void 522 around the fuse element 529, the hot air will vent through the vent hole 524, blowing off the vent cover 526. The sudden release of the pressure will cause the arc to blow-out. There will be little vaporized bond wire material left inside the cavity, thus the probability of reforming a secondary conductive path is very low. The vaporized bond wire material is allowed to exit the vent, which prevents subsequent deposition of conductive material in the cavity so that no secondary conductive path forms. In an additional alternative, getter material can be included in the cavity to collect the vaporized fuse element material so as to further prevent a secondary conductive path from forming.

Many shapes of fuses that can form fuse elements for use in the embodiments have been designed and are available, and the fuse elements shown hereinabove are illustrative examples to assist in describing and illustrating the operation of the example embodiments. Fusible links formed of conductors joined by a material that melts such as a solder can be used as a fuse element. Wire connections with a smaller cross-section portion forming the fuse element can be used. As described hereinabove, conductive metal clips or strips with a first thickness or width coupling a leadframe terminal to a terminal of the integrated circuit can be used, with a portion of a smaller cross-section of the metal clip forming the fuse element. These alternatives form additional embodiments that are within the scope of the appended claims.

Modifications are possible in the described example embodiments, and other embodiments are possible within the scope of the claims.

What is claimed is:

1. An apparatus, comprising:
   an integrated circuit die having multiple terminals;
   a leadframe having a die pad portion, the integrated circuit die positioned on and attached to the die pad portion;
   the leadframe having leads for external connections, at least some of the leads having an inner portion electrically coupled to at least one terminal selected from the multiple terminals of the integrated circuit die;
   a fuse element coupled between one of the leads of the leadframe and at least one terminal selected from the multiple terminals of the integrated circuit die; and
   encapsulation material surrounding the integrated circuit die and the leadframe to form a packaged integrated circuit including the integrated circuit die and the fuse element, and having a cavity in the encapsulation material surrounding the fuse element such that the fuse element is spaced from the encapsulation material.

2. The apparatus of claim 1, in which the cavity is a void in the encapsulation material surrounding the fuse element.

3. The apparatus of claim 2, and further including a vent extending from the cavity to an external surface of the encapsulation material.

4. The apparatus of claim 3, and further including a cover material covering the vent at an exterior surface of the encapsulation material.

5. The apparatus of claim 4, in which the cover material is arranged to blow away from the vent in response to gas pressure in the cavity.

6. The apparatus of claim 1, in which the cavity includes a sublimatable sacrificial encapsulant material (SSEM) surrounding the fuse element.

7. The apparatus of claim 1, in which the fuse element is a fusible link to form an open circuit in an overcurrent condition.

8. The apparatus of claim 1, in which the fuse element is a bond wire to form an open circuit in an overcurrent condition.

9. The apparatus of claim 1, in which the fuse element is formed by a first portion of a metal clip having a first thickness, a second portion of the metal clip having a second thickness greater than the first thickness.

10. The apparatus of claim 1, in which the fuse element is a wire of a first diameter, coupled to bond wire portions of a second diameter that is greater than the first diameter.

11. The apparatus of claim 1, in which the integrated circuit die includes a transistor and the fuse element is coupled in series between a terminal of the integrated circuit die and a lead of the leadframe.

12. The apparatus of claim 1, in which the fuse element is configured to heat up and burn during an overcurrent event, and the fuse element is to subsequently form an open circuit.

13. A power integrated circuit with overcurrent protection, comprising:
    an integrated circuit die including a FET disposed on a portion of a leadframe and having a source terminal, a gate terminal, and a drain terminal;
    bond wires coupling external terminals of the leadframe to at least one of the source, drain and gate terminals of the integrated circuit die;
    a fuse element coupled in series between an external terminal of the leadframe and at least one of the source terminal and the drain terminal of the integrated circuit die;
    encapsulation material surrounding the integrated circuit die and the leadframe to form a packaged integrated circuit, the encapsulation material being spaced from the fuse element by a cavity in the encapsulation material, the fuse element being surrounded by the cavity; and
    a vent extending from an exterior surface of the packaged integrated circuit to the cavity and being covered by a vent cover material configured to blow off the vent in response to pressure in the cavity.

14. The power integrated circuit of claim 13, in which the cavity includes a void containing air.

15. The power integrated circuit of claim 13, in which the cavity includes sacrificial sublimatable encapsulation material (SSEM) surrounding the fuse element.

* * * * *